United States Patent [19]

Davis

[11] 3,858,062

[45] Dec. 31, 1974

[54] SOLID STATE CURRENT DIVIDER

[75] Inventor: William F. Davis, Tempe, Ariz.

[73] Assignee: Motorola, Inc., Franklin Park, Ill.

[22] Filed: Feb. 15, 1973

[21] Appl. No.: 332,834

[52] U.S. Cl. .................. 307/297, 307/237, 307/303, 357/35, 357/48

[51] Int. Cl. .................. H01l 19/00

[58] Field of Search ........... 307/303, 254, 237, 297; 317/235 Y, 235 E, 16

[56] References Cited

UNITED STATES PATENTS

| | | | |
|---|---|---|---|
| 2,982,866 | 5/1961 | Chow | 307/237 X |
| 3,164,788 | 1/1965 | Vlasak | 307/237 X |
| 3,185,858 | 5/1965 | Flatten | 307/237 X |
| 3,241,013 | 3/1966 | Evans | 307/303 X |
| 3,275,912 | 9/1966 | Kunz | 307/303 X |
| 3,449,682 | 6/1969 | Miwa et al. | 307/303 X |
| 3,522,480 | 8/1970 | Routh et al. | 307/237 X |
| 3,624,426 | 11/1971 | Saari | 307/297 |

OTHER PUBLICATIONS

Frederiksen et al., "Transistor Advances," Motorola Monitor, April 1970, Vol. 8, No. 1, p. 24.

*Primary Examiner*—Stanley D. Miller, Jr.
*Assistant Examiner*—William D. Larkins
*Attorney, Agent, or Firm*—Vincent J. Rauner; Willis E. Higgins

[57] ABSTRACT

A solid state current divider is disclosed wherein two transistors are arranged with the emitter of the input transistor connected to a source of current to be divided and the collector of the output transistor connected to the load device receiving the divided current. The bases of the two transistors are connected together and to a source of voltage for forward biasing the emitter-base junction of the first transistor. The collector of the first transistor is connected to the emitter of the second transistor. The first transistor is driven into saturation causing the emitter-base junction of the second transistor to forward bias. Under these circumstances the carriers collected by the collector of the first transistor are reinjected by the collector of the first transistor and by the emitter of the second transistor in proportion to the areas of the collector-base junction of the first transistor and the emitter-base junction of the second transistor.

The transistors may be PNP lateral devices or NPN vertical devices formed by utilizing N doped epitaxial islands deposited on a P doped substrate and isolated from each other by P+ doped diffusions.

11 Claims, 3 Drawing Figures

PATENTED DEC 31 1974

3,858,062

SOLID STATE CURRENT DIVIDER

BACKGROUND OF THE INVENTION

This invention relates to solid state current dividers, more particularly to such current dividers made in integrated circuit form and it is an object of the invention to provide an improved current divider of this nature.

Current dividers are known to the prior art. For example, the collector of an ordinary PNP transistor may be divided into parts so that each part collects a portion of the total emitted current. That portion of the collector current may then be used as desired. Such current dividers are not always as effective as desired and present difficulties in obtaining the wide range of current divisions which may be necessary.

For example, in automobile control circuits whereby integrated circuits may be on and drawing current when the ignition is turned off, it is highly desirable that the current drawn be very small. In turn this current should be dividable by a factor of 10 or more from a reference current before being used by some device. Thus 10 or more devices may be energized without undue loading of the battery in contrast to ten or more devices directly referenced to the reference current. Accordingly, it is a further object of the invention to provide an improved solid state current divider which overcomes the disadvantages of the prior art.

Integrated circuits may be advantageously utilized in modern automotive electrical systems, for example, in ignition systems or in seat belt interlock systems, affording substantial cost savings. However, the automotive environment has been found to be an exceptionally harsh one for semiconductor circuits in general, and for integrated circuits in particular. As a result, unexpected problems and requirements have arisen in the design of integrated circuits which must perform reliably in automotive electrical systems, and in other high-noise environments. A wide range of temperatures may occur in the automotive environment. Further, a wide range of spurious signals typically occur throughout the wiring of an automotive electrical system. For example, relatively low energy signals of either positive or negative polarity having magnitudes of several hundred volts, sometimes referred to as "noise" signals, typically occur on wiring lines connecting various sensors to input terminals of integrated circuit devices. Such noise signals may cause malfunctions in the operation of prior art integrated circuit devices, or may even cause destruction of them, and further may destroy discrete semiconductor devices such as power transistors controlled by the integrated circuit. Further, discontinuities in the main power lines of an automotive electrical system, such as interruptions in the connection to the 12 volt automobile battery, may cause severe, high-energy transient voltages, sometime called "load dump" voltages, of over 100 volts to occur on the main power lines. The load dump transient voltages may destroy the integrated circuit devices of the prior art in the absence of expensive external protective measures.

It is a further object of the invention to provide an improved current divider of the nature indicated having usefulness in automobile environment, as well as others, wherein a pair of lateral transistors are formed on a common substrate.

It is a further object of the invention to provide an improved current divider of the nature indicated wherein a pair of vertical transistors are formed on a common substrate.

SUMMARY OF THE INVENTION

In carrying out the invention according to one form, there is provided solid state means for providing a predetermined ratio of an input current to an output current comprising: a first transistor having a first emitter region, a first base region and a first collector region, a second transistor having a second emitter region, a second base region and a second collector region, said first emitter region being adapted to be connected to a current source, said first and second base regions being connected together and being adapted to be connected to a voltage source whereby the junction formed by said first emitter and said first base is forward biased during operation, said first collector being connected to said second emitter, and said second collector being adapted to be connected to an output.

In carrying out the invention according to a further form, there is provided integrated circuit means for providing a predetermined ratio of an input current to an output current comprising: a first transistor and a second transistor formed on a common substrate, each of said transistors including emitter regions and collector regions, each of said transistors including a base region connected to each other and being adapted to be connected to a voltage source, whereby the emitter base junction of said first transistor is forward biased during operation, the emitter region of said first transistor being adapted to be connected to a current source, the collector region of said second transistor being adapted to be connected to an output circuit, and the collector region of said first transistor being connected to the emitter region of said second transistor.

DESCRIPTION OF THE PREFERRED EMBODIMENTS

Figure 1:
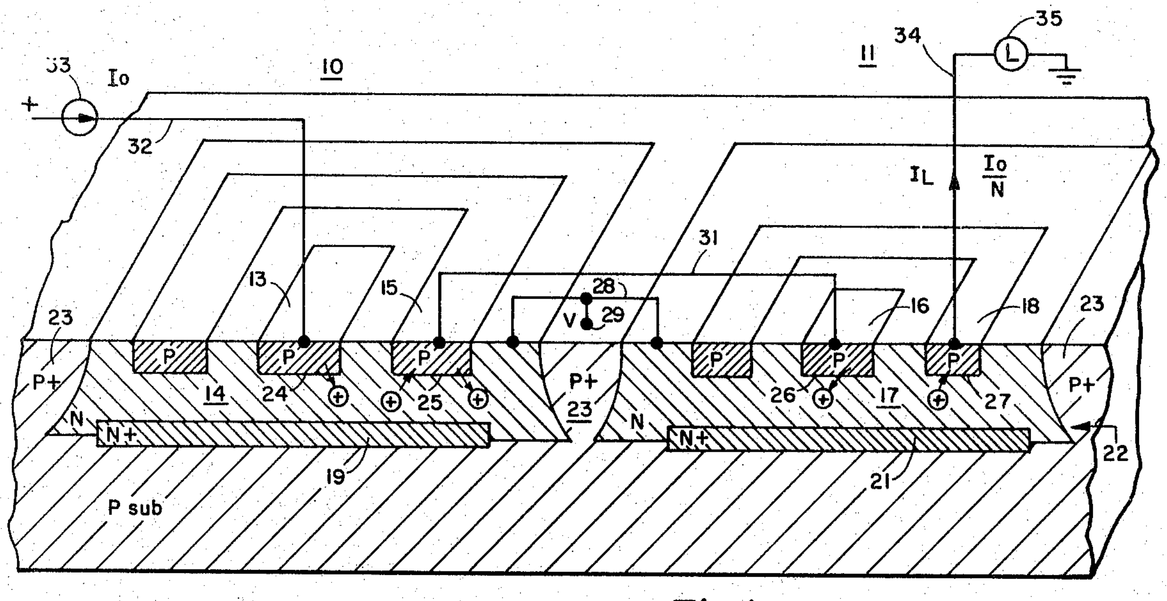
FIG. 1 is a diagrammatic sectional view in perspective of one form of the invention.

Referring to the drawing, the invention is shown in FIG. 1 as comprising a pair of lateral PNP transistors 10 and 11 formed as part of an integrated circuit on a P doped substrate 12. The transistor 10 comprises an emitter region 13, a base region 14 and a collector region 15. The transistor 11 comprises an emitter region 16, a base region 17 and a collector region 18.

As is well understood in this art a substrate or wafer 12 of appropriate P doping level has provided thereon N+ regions 19 and 21 as by diffusion for example. On the upper surface of the substrate layer 12 and the N+ doped layers 19, and 21 there is formed an epitaxial layer 22 having a desired level of N doping. After the epitaxial layer 22 is formed, P+ diffusions 23 are formed into and through the epitaxial layer until the P+ regions reach the substrate 12. The P+ regions 23 thus isolate the N epitaxial regions 14 and 17 into islands as shown. The N+ regions 19 and 21 become buried layers in the structure, acting as is well understood to decrease the resistance in the base regions 14 and 17 and to prevent the collection of carriers by the substrate 12.

After appropriate masking and windowing thereof has been carried out as is well understood and therefore not further described, the P doped regions 13, 15, 16 and 18 may be diffused into the epitaxial islands 14 and 17 to form the emitters and collectors of the transistors as already described. The P emitter 13 and the N base 14 form an emitter base junction 24 and the P collector 15 and the N base 14 form a PN base collector junction 25. Similarly the P emitter 16 and the N base 17 form an emitter base PN junction 26 and the P collector 18 and the N base 17 form a collector base PN junction 27. While the collector 15 is shown surrounding the emitter 13 and the collector 18 it is shown surrounding the emitter 16, it will be understood that this is exemplary and other geometrical arrangements may be used.

In the completed structure the base regions 14 and 17 are connected together by a conductor 28 which is adapted to be connected as by a terminal 29 to a suitable source of voltage V. The collector 15 is connected to the emitter 16 by a conductor 31, the emitter 13 is provided with a conductor 32 which is connectable to a current source 33 and which, in turn, is connected to a source of plus voltage as shown. The collector 18 is provided with a conductor 34 which is connectable to some load or utilization device 35 which in turn is adapted to be connected to ground as shown.

Figures 2, 3:
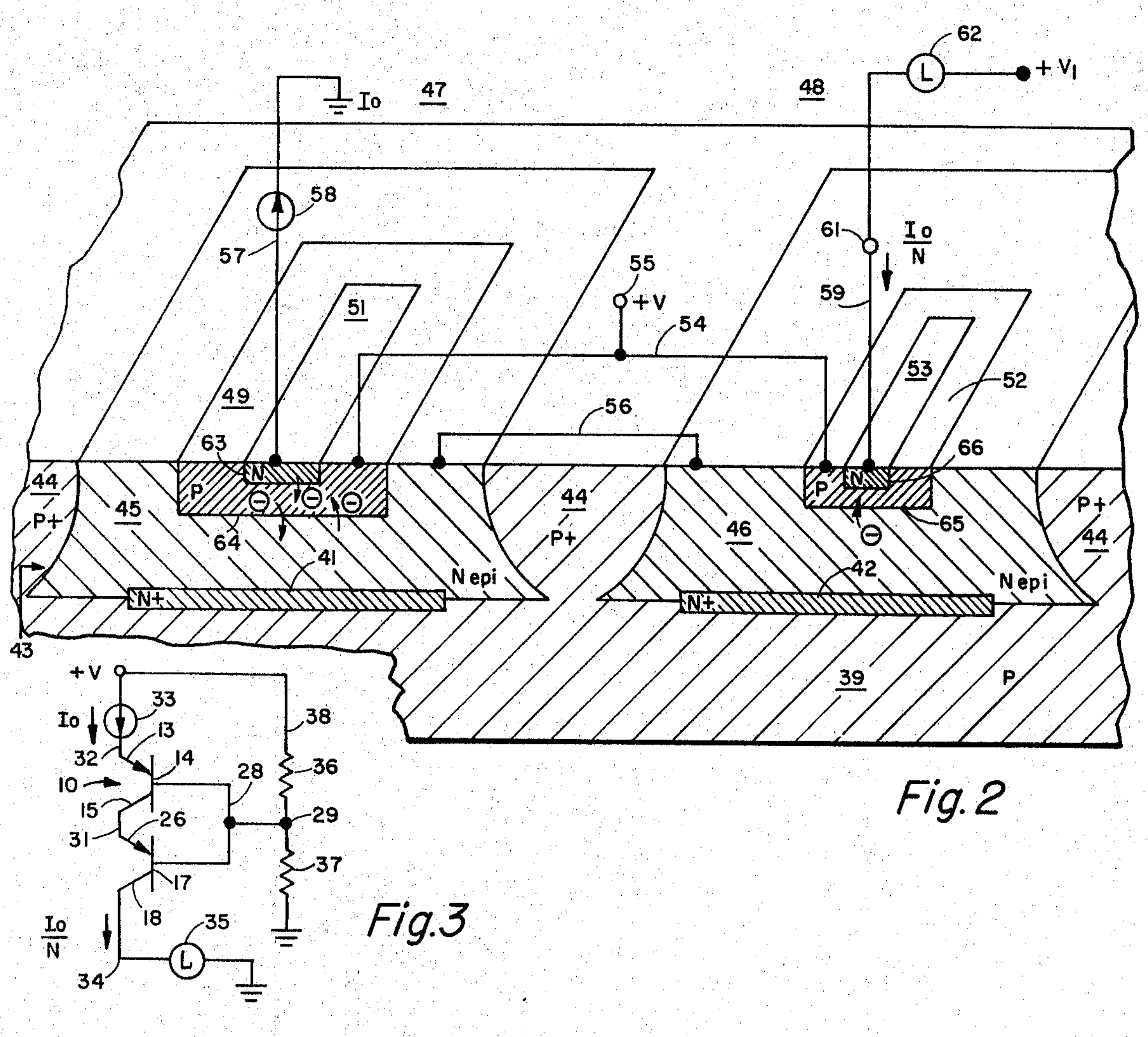
FIG. 2 is a view similar to FIG. 1 of another form of the invention.
FIG. 3 is a circuit diagram useful in explaining the functioning of the invention.

Referring to FIG. 3 a circuit diagram corresponding to the transistors 10 and 11 and the associated circuitry for functioning is shown with corresponding reference characters applied.

During operation the current source 33 forces a reference or input current $I_o$ to flow through conductor 32 and into the emitter or emitter region 13. The emitter 13 injects holes across the PN junction 24 and into the base or base region 14 as shown by the arrow as is well understood. Some of these injected holes recombine with negative carriers in the base region 14 and pass out of the base by means of conductor 28 and terminal 29 to the voltage V. The junction 24 is forward biased by the voltage existing thereacross which is obtained, for example, as is shown in FIG. 3, by the pair of resistors 36 and 37 connected together at terminal 29 and having their other terminals connected respectively to ground and to the source of plus voltage through conductor 38. Some of the positive carriers, holes, are collected by the collector or collector region 15 and tend to raise the potential of the collector 15 which is floating in potential with respect to the base region 14. The collector 15 is connected by conductor 31 to the emitter or emitter region 16 whereby the emitter or emitter region 16 also tends to rise in potential and, of course, is always at the same potential as the collector 15.

Under the influence of the current $I_o$ the holes collected by collector 15 raise the potential of the collector 15 and thus the emitter 16 to the point where the collector 15 and the emitter 16 reinject carriers, holes, into the base or base regions 14 and 17, respectively. This occurs when the PN junctions 25 and 26 become forward biased which for silicon for example will be of the order of seven-tenths of a volt. The collection of holes by collector 15 and the reinjection of holes by collectors 15 and 16 into the respective base regions 14 and 17 occur so as to maintain the potential of collector 15 at the equilibrium level of saturation and at the same time the emitter 16 is maintained at the forward bias potential of approximately seven-tenths of a volt. Some of the carriers, holes, reinjected by the emitter 16 into the base region 17 recombine with negative carriers in base region 17 and pass out of the base as base current through conductor 28. The remainder of the emitted injected carriers are collected by the collector 18 across the PN junction 27 and pass out of the collector 18 by means of conductor 34 to the load device 35. The current flowing through conductor 34 and into the load is shown as $I_o^N$, N being the factor by which the input or reference current $I_o$ is divided to give the load current.

Since the emitter 16 is floating with respect to the base region 17, and the collector 15 is floating with respect to the base region 14, the number of carriers collected by the collector 15 must be immediately reinjected because the collected current cannot find any external path to ground except by reinjection. The collected carriers are distributed, so to speak, through the regions 15 and 16 and are simultaneously reinjected into the base regions 14 and 17 by the emitter 16 and the collector 15. The reinjections are proportional to the areas of the junction 25 and the junction 26. Thus the number of charges reinjected by the emitter region 16 is smaller than the number of charges reinjected by collector 15 in proportion to the junction areas. As shown in FIG. 1 the area of junction 26 is substantially less than the area of junction 25 and thus the amount of current available to inject carriers into the base region 17 from emitter 16 is substantially reduced. Accordingly the number of charges which can be collected by the collector 18 is reduced and consequently the output current in conductor 34 $I_L$ is less than the current $I_o$ by a factor which is proportional to the relative cross sectional areas of the junctions 25 and 26. The output current $I_L$ and the input current $I_o$ are related according to the expression $I_o/I_L = N_1N(A_1A_2)$ where $I_o$ is the input current, $I_L$ is the output or load current, $N_1$ is the collection efficiency of collector 15, $N_2$ is the collection efficiency of collector 18, $A_1$ is the area of junction 25 and $A_2$ is the area of junction 26. Thus it can be seen that by selecting the area of junction 26 relative to the area of 25 essentially any division of current as between the input current $I_o$ and the output current $I_L$ may be obtained.

The efficiencies of collection may of course also be selected as is well understood in this art in order to obtain the desired division of current but efficiencies are too variable to rely upon alone for this purpose. As shown in FIG. 1 the emitter region 16 is reduced over the emitter region 13 and the collector region 18 is reduced over the collector region 15. The dimensions of these regions may be made as is well understood by those in this art to meet the particular circumstances. Thus it is seen that any splitting or division of current may be obtained to give any output current desired as compared to an input current.

While the structure of FIG. 1 is that of a lateral PNP transistor combination, it is only one form of structure that will function according to the invention. Referring to FIG. 2 there is shown a vertical NPN form of transistor combination shown which also functions according to the invention.

Similarly to FIG. 1, in FIG. 2 there is shown a P doped substrate layer 39 on which N+ diffusion layers 41 and 42 have been formed in any well known manner. On top of the P substrate 39 and the diffusion layers 41 and 42 an epitaxial layer 43 of N doping is formed, as is well understood, to any desired depth. Following the growth of the epitaxial region 43 P+ diffusions 44 are formed through the epitaxial layer to the substrate 39 whereby the N epi islands 45 and 46 are formed as shown. The epi island 45 becomes the collector of an NPN transistor 47 and the epi island 46 becomes the emitter of an NPN transistor 48. A P diffusion 49 made into the epi region 45 becomes the base of transistor 47 and an N type diffusion 51 into the base region 49 becomes the emitter region of transistor 47. A P doped region 52 is diffused into the emitter 46 and becomes the base of transistor 48 and an N type region 53 is diffused into the base 52 and becomes the collector region of the transistor 48. The base regions 49 and 52 are connected together by means of a conductor 54 which in turn extends to a terminal 55 adapted to be connected to a source of plus voltage V. Similarly the collector region 45 and the emitter region 46 are connected together by a conductor 56.

The emitter region 51 of transistor 47 is connected through a conductor 57 to a current source 58 and thus to a source of minus voltage. The current source 58 connected to conductor 51 forms in effect an input circuit which drives current I from the transistor 47 to ground. Similarly the collector 53 of transistor 48 is connected through the conductor 59 to a terminal 61 which in turn is connected to a load device 62 or some utilization circuit through a conductor to a positive supply as shown. The emitter region 51 forms an NP junction 63 with the P base region 49 and the P base region forms an NP junction 64 with the collector 45. Correspondingly the emitter region 46 forms an emitter base junction 65 with base regions 52 and the collector region 53 forms an NP junction 66 with the P base region 52.

During operation the forward bias of the PN junction 63 causes the emitter 51 to inject negative carriers into the base region 49. Some of these carriers are recombined in the base region and flow outwardly as base current through conductor 54. The negative carriers which are collected by the collector region 45 raise the voltage of this region and that of the emitter region 46 at the same time, since these regions are connected by conductor 56, until the emitter region 46 becomes forward biased with respect to the base region 52 at about seven-tenths volt for silicon. At this point the collector base junction 64 of transistor 47 is also forward biased and the transistor 47 is in a state of saturation. Of the carriers collected by collector 45 a certain portion is reinjected into the base region 49 across the junction 64 and the remaining portion thereof is reinjected by emitter 46 into the base region 52 across the emitter and base junction. The carriers collected by the collector region 53 become the output current I/N.

Of the carriers collected by collector region 45, the number reinjected into the base region 49 and the number reinjected into the base region 52 are determined by the relative areas of the junctions 64 and 65. In the form shown, the area of junction 64 is substantially larger than the area of junction 65 and thus the number of carriers which are reinjected into the base region 52 is substantially smaller than the number of carriers reinjected into base region 49. Accordingly the current available to flow in conductor 59 and through the load device 62 is substantially smaller than that flowing in conductor 52 substantially in accordance with the formula previously described for that form of the invention shown in FIG. 1.

What is claimed is:

1. Solid state means for providing a predetermined ratio of an input current to an output current comprising:

a first transistor having a first emitter region, a first base region and a first collector region, a second transistor having a second emitter region, a second base region and a second collector region, input direct current source means, bias source means, output direct current to load means, said first emitter region being connected to said input direct current source means, said first and second base regions being connected together, said connected together first and second base regions being connected to said bias source means for forward biasing the junction formed by said first emitter and said first base during operation, said first collector being connected to said second emitter; and said second collector being connected to said output direct current to load means, output direct current flowing through said load means.

2. The solid state means according to claim 1 wherein said first and said second transistors are adjacent transistors isolated from each other and mounted on a common substrate.

3. The solid state means according to claim 2 wherein said substrate comprises a silicon layer of P type doping, and said first and said second base regions are epitaxial regions formed on said substrate and are of N type doping.

4. The solid state means according to claim 3 wherein the first emitter region and the first collector region are P type diffusions into said first base region and the second emitter region and the second collector region are P type diffusions into said second base region.

5. The solid state means according to claim 2 wherein said substrate comprises a silicon layer of P type doping, and said first collector region and said second emitting region are epitaxial regions formed on said substrate and are of N type doping.

6. The solid state means according to claim 5 wherein the first base region is a P type diffusion into said first collector, said first emitter region is an N type diffusion into said first base region, said second base region is a P type diffusion into said second emitter region and said second collector region is an N type diffusion into said second base region.

7. A circuit for producing a predetermined ratio of an input current to an output current comprising:

an integrated circuit including:

1. first and second spaced regions of one conductivity type in a semiconductor substrate of opposite conductivity type, 2. third and fourth regions formed in said first region, said third and fourth regions being of such conductivity type and positioned in said first region so as to form, with said first region, a first transistor having emitter, base and collector electrodes, and 3. fifth and sixth regions formed in said second region, said fifth and sixth regions being of such conductivity type and positioned in said second region so as to form, with said second region, a second transistor having emitter, base and collector electrodes, an input direct current source means connected to the one of said regions forming the emitter electrode of said first transistor, means connecting together the two of said regions forming the base electrodes of said first and second transistors, a bias source means connected to the two of said regions forming said base electrodes of said first and second transistors, means connecting together the two of said regions forming the collector electrode of said first transistor and the emitter electrode of said second transistor, a load means connected to the one of said regions forming the collector electrode of said second transistor, output direct current flowing through said load means the dimensions of the four of said regions forming the base electrodes of said first and second transistors, the collector electrode of said first transistor and the emitter electrode of said second transistor being such that the ratio of the junction area between said regions forming the base and collector electrodes of said first transistor to the junction area between said regions forming the emitter and base electrodes of said second transistor is proportional to the predetermined ratio of input direct current from said direct current input source to output direct current flowing through said load means.

8. The circuit of claim 7 in which said third and fourth regions are spaced apart from each other within said first region, are of opposite conductivity type to said first region and form the emitter and collector electrodes of said first transistor.

9. The circuit of claim 8 in which said fifth and sixth regions are spaced apart from each other within said second region, are of opposite conductivity type to said second region, and form the emitter and collector electrodes of said second transistor.

10. The circuit of claim 7 in which said fourth region is contained within said third region and is of opposite conductivity type thereto, said third and fourth regions forming the emitter and base electrodes of said first transistor.

11. The circuit of claim 10 in which said sixth region is contained within said fifth region and is of opposite conductivity type thereto, said fifth and sixth regions forming the base and collector electrodes of said second transistor.

* * * * *